United States Patent
Ban

(10) Patent No.: US 9,049,810 B2
(45) Date of Patent: Jun. 2, 2015

(54) DEVICE MOUNTER HEAD AND DEVICE MOUNTING METHOD USING THE SAME

(75) Inventor: Jong-eok Ban, Changwon (KR)

(73) Assignee: SAMSUNG TECHWIN CO., LTD., Changwon (KR)

(*) Notice: Subject to any disclaimer, the term of this patent is extended or adjusted under 35 U.S.C. 154(b) by 789 days.

(21) Appl. No.: 13/159,048

(22) Filed: Jun. 13, 2011

(65) Prior Publication Data

US 2011/0302766 A1 Dec. 15, 2011

(30) Foreign Application Priority Data

Jun. 14, 2010 (KR) .................. 10-2010-0056199

(51) Int. Cl.
*B23Q 7/00* (2006.01)
*H05K 13/04* (2006.01)

(52) U.S. Cl.
CPC ....... *H05K 13/0408* (2013.01); *Y10T 29/49998* (2013.01); *Y10T 29/53991* (2013.01); *Y10T 29/5313* (2013.01); *Y10T 29/53174* (2013.01); *Y10T 29/53178* (2013.01); *Y10T 29/53191* (2013.01); *Y10T 29/53* (2013.01); *H05K 13/0413* (2013.01); *H05K 13/04* (2013.01); *H05K 13/0452* (2013.01)

(58) Field of Classification Search
CPC .......... H05K 13/0408; H05K 13/0452; H05K 13/0413; H05K 13/04; Y10T 29/53991; Y10T 29/49998; Y10T 29/53; Y10T 29/5313; Y10T 29/53174; Y10T 29/53178; Y10T 29/53191

USPC ............ 29/559, 283, 740, 739, 743, 729, 700
See application file for complete search history.

(56) References Cited

U.S. PATENT DOCUMENTS

| | | | |
|---|---|---|---|
| 6,276,051 B1* | 8/2001 | Asai et al. ....................... | 29/740 |
| 6,648,215 B2 | 11/2003 | Leu | |
| 2006/0207090 A1* | 9/2006 | Kawada .......................... | 29/832 |

FOREIGN PATENT DOCUMENTS

| | | |
|---|---|---|
| JP | 64-041230 A | 2/1989 |
| JP | 08-213796 A | 8/1996 |

* cited by examiner

*Primary Examiner* — Peter DungBa Vo
*Assistant Examiner* — Azm Parvez
(74) *Attorney, Agent, or Firm* — Sughrue Mion, PLLC

(57) ABSTRACT

A device mounter head and a device mounting method using the device mounter head are provided. The device mounter head includes: a cylinder block unit including at least one cylinder in which a piston unit moving along the at least one cylinder is disposed; a pressure control unit which controls pressure inside and outside the at least one cylinder so that the piston moves along the at least one cylinder based on the controlled pressure; and a nozzle which is connected to the piston unit, and includes an inlet exposed to an atmosphere outside the cylinder block unit and a nozzle communication vent connected to the inlet and provided with the controlled pressure, wherein the inlet is configured to suck, grab and release a component using the controlled pressure.

19 Claims, 15 Drawing Sheets

DEVICE MOUNTER HEAD AND DEVICE MOUNTING METHOD USING THE SAME

CROSS-REFERENCE TO RELATED PATENT APPLICATION

This application claims priority from Korean Patent Application No. 10-2010-0056199, filed on Jun. 14, 2010, in the Korean Intellectual Property Office, the disclosure of which is incorporated herein in its entirety by reference.

BACKGROUND

1. Field

Apparatuses and methods consistent with exemplary embodiments relate to a device mounter head, and more particularly, to a device mounter head for mounting components on a substrate and the like after grabbing the components and transferring the components and a device mounting method using the device mounter.

2. Description of the Related Art

A device mounter head operates by grabbing electronic components, transferring the electronic components, and then mounting the electronic components on a substrate, as an apparatus for mounting electronic components such as semiconductors and the like on a substrate.

The device mounter head includes a nozzle spindle with an inlet port, and controls grabbing of electronic components and separating of the electronic components from the device mounter head by controlling air pressure of the inlet port.

However, a time delay may occur in a pipeline communicating with the inlet port of the nozzle spindle. In addition, the time delay may occur also in a solenoid valve disposed inside the pipeline. Like this, in a case where the time delay occurs in the device mounter head, it is not possible to control precisely a timing of forming or clearing negative pressure in the inlet port of the nozzle spindle.

The nozzle spindle is disposed in such a way that the nozzle spindle may move up and down and rotate, and because of the time delay problem mentioned above, an interval is necessary between a time of controlling a movement of the nozzle spindle and a time of controlling the air pressure of the inlet port. Accordingly, an operation speed of the device mounter head is slowed down. As a result, a time required for a device mounting process increases.

In addition, in the device mounter head, a control for the air pressure of the inlet port and a control for the movement of the nozzle spindle are independent from each other, and thus, hardware of the device mounter head is complicated.

SUMMARY

One or more exemplary embodiments provide a device mounter head having a simple structure and a simple controlling scheme, and for reducing effectively a time delay in controlling air pressure of an inlet port of a nozzle spindle.

One or more exemplary embodiments also provide a device mounting method using the device mounter head.

According to an aspect of an exemplary embodiment, there is provided a device mounter head. The device mounter head includes a cylinder block unit including a cylinder space, a first communication vent through which the cylinder space and another space provided inside or outside the cylinder block unit communicate with each other, and a second communication vent disposed below the first communication vent and through which the cylinder space and the other space communicate with each other. The device mounter head further includes a piston unit which moves between the first communication vent and the second communication vent in the cylinder space, a nozzle spindle disposed on a lower side of the piston unit, and in which an end having an inlet is protruded from the cylinder block unit and a nozzle communication vent communicating with the inlet is formed on a side of the nozzle spindle, a pressure controlling portion which provides predetermined pressure in the other space; and a valve unit which moves relative to the cylinder block unit and allows or blocks communication between the other space and at least one of the first communication vent and the second communication vent.

According to an aspect of another exemplary embodiment, there is provided a method of mounting a component on a substrate using the device mounter head, the method including positioning the valve unit in such a way that communication between the first communication vent and the other space is blocked and the second communication vent communicates with the other space, and then, lowering the nozzle spindle so that the nozzle spindle approaches the component; positioning the valve unit in such a way that the first and second communication vents communicate with the other space, and then, raising the nozzle spindle in a state where the nozzle spindle sucks and grabs the component; moving the device mounter head; positioning the valve unit in such a way that communication between the first communication vent and the other space is blocked and the second communication vent communicates with the other space, and then, lowering the nozzle spindle, in the state where the nozzle spindle sucks and grabs the component, so that the component is mounted on the substrate; clearing the state where the nozzle spindle sucks and grabs the component; and positioning the valve unit in such a way that the first communication vent communicates with the other space and communication between the second communication vent and the other space is blocked, and then raising the nozzle spindle.

BRIEF DESCRIPTION OF THE DRAWINGS

The above and other aspect will become more apparent by describing in detail exemplary embodiments with reference to the attached drawings, in which.

DETAILED DESCRIPTION OF EXEMPLARY EMBODIMENTS

Hereinafter, exemplary embodiments will be described in detail with reference to the attached drawings.

Figure 1:
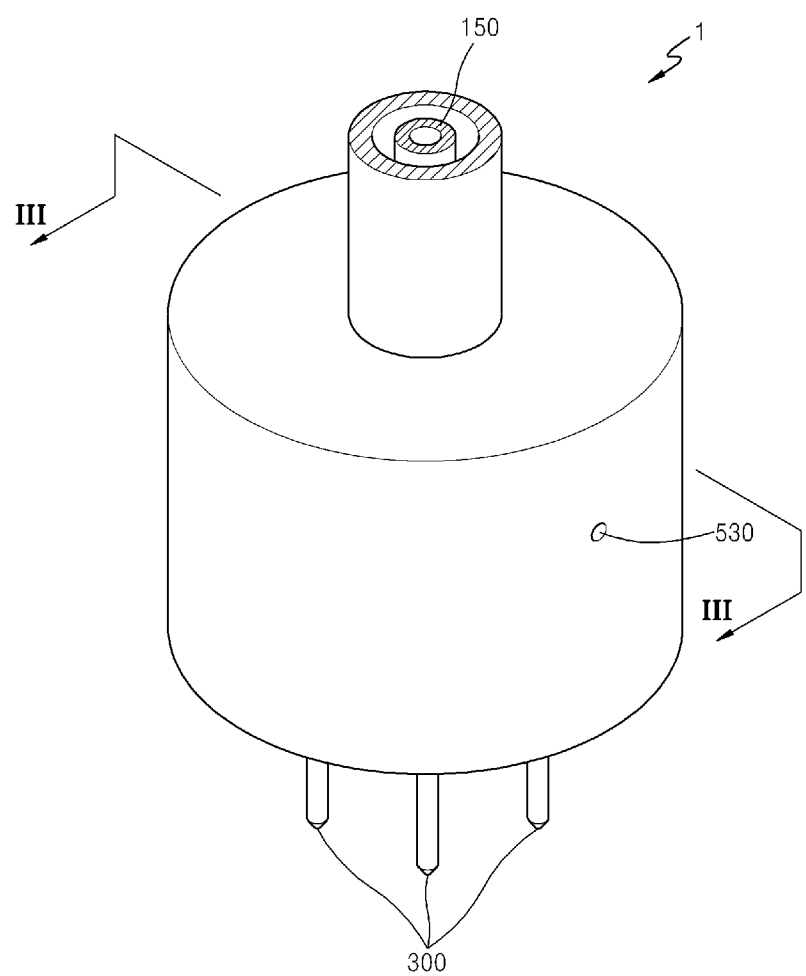
FIG. 1 is a perspective view of a device mounter head according to an exemplary embodiment.
Figure 2:
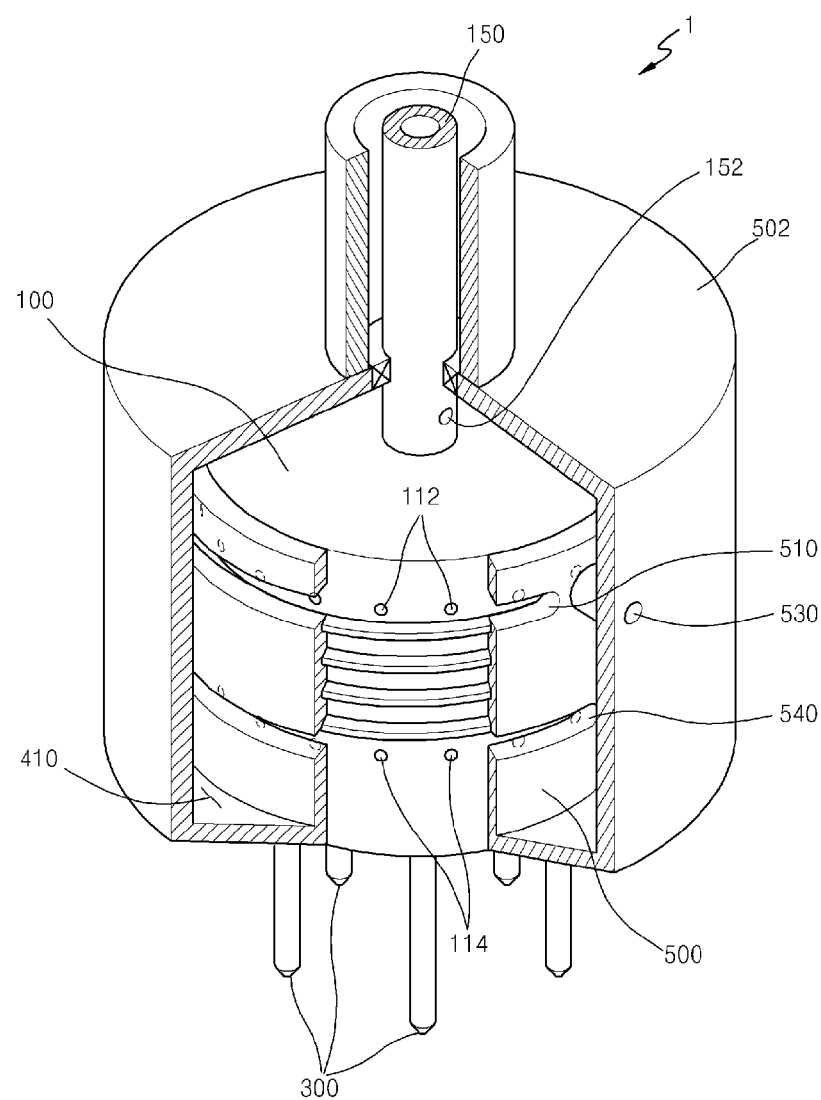
FIG. 2 is a perspective view of the device mounter head of FIG. 1 in which a part is cut out, according to an exemplary embodiment.
Figure 3:
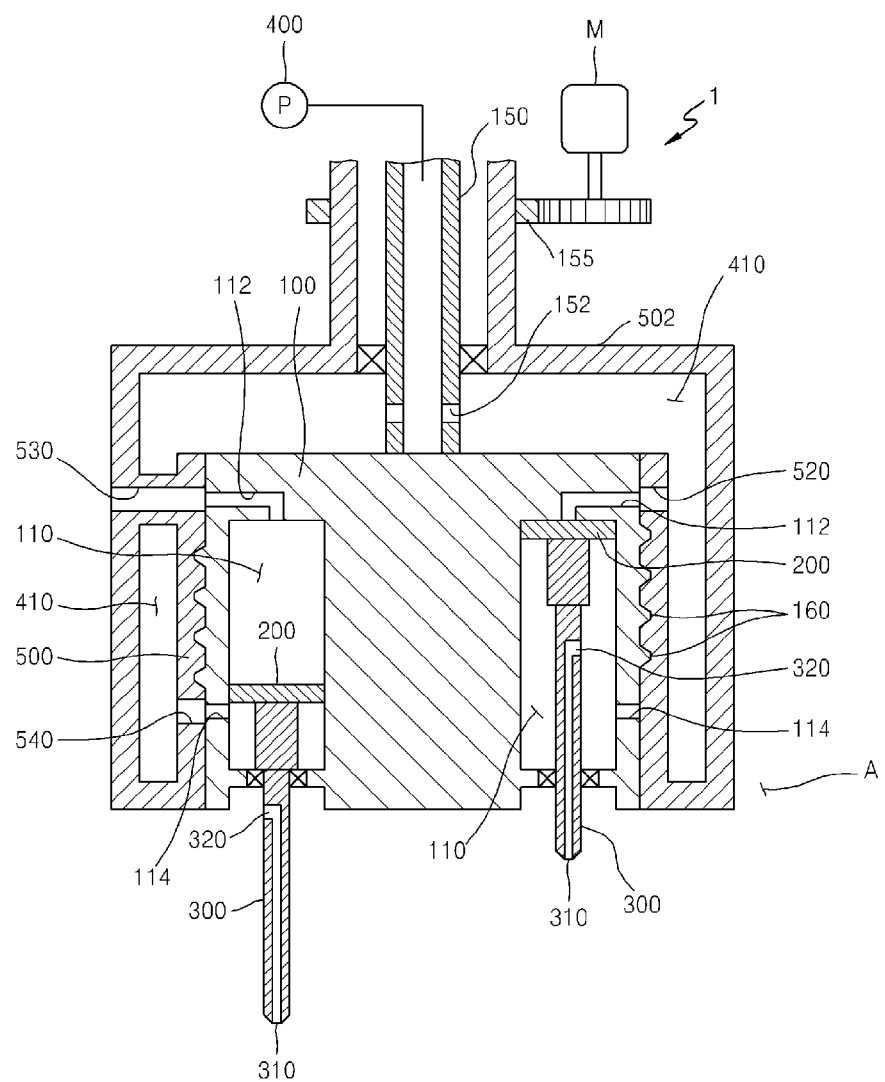
FIG. 3 is a cross-sectional view taken along a line III-III of the device mounter head of FIG. 1, according to an exemplary embodiment.
Figure 4:
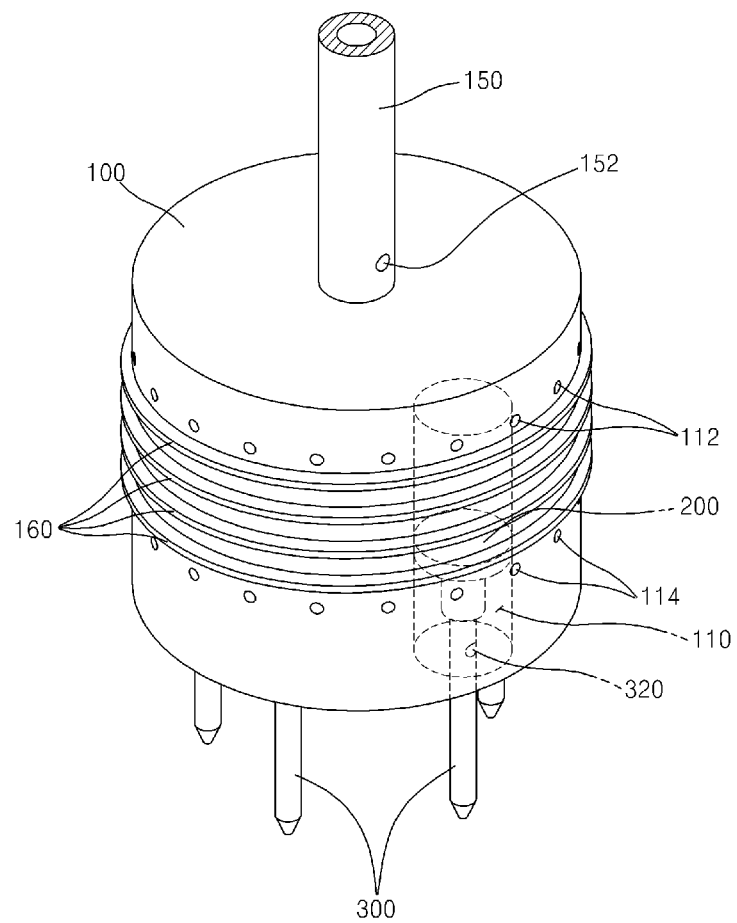
FIG. 4 is a perspective view illustrating a configuration of a part of the device mounter head of FIG. 1, according to an exemplary embodiment.
Figure 5:
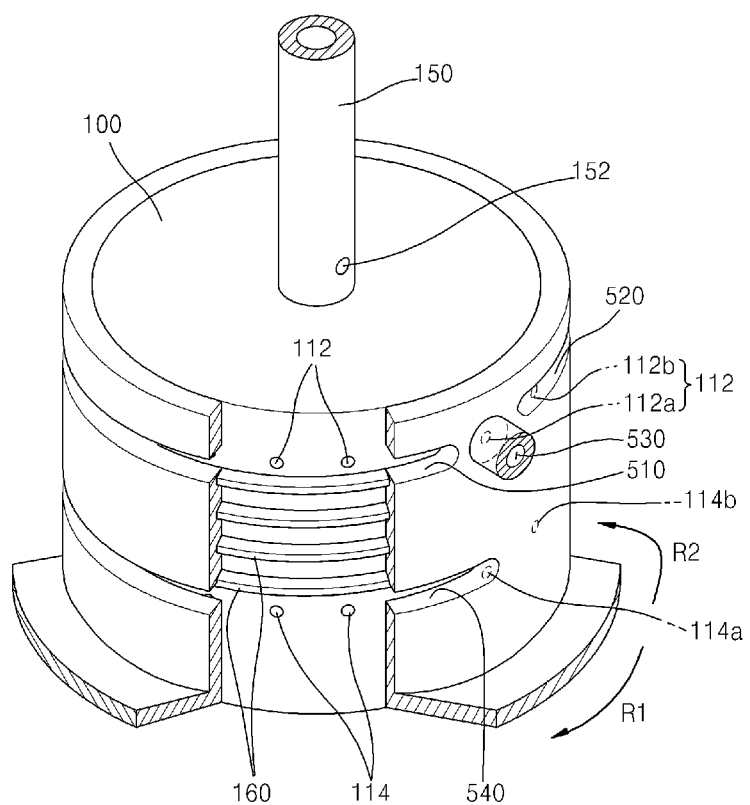
FIG. 5 is a perspective view illustrating the configuration of the part of FIG. 4 together with a configuration of another part of the device mounter head of FIG. 1, according to an exemplary embodiment.
Figure 6A:
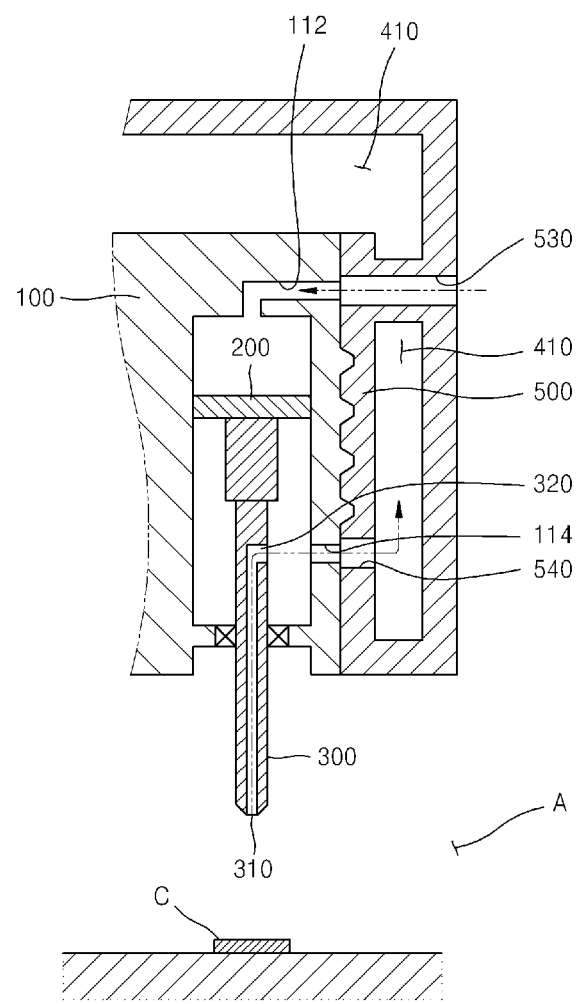
FIG. 6A is a cross-sectional view illustrating roughly a part of the device mounter head of FIG. 1 to show partially an operation state of the device mounter head of FIG. 1, according to an exemplary embodiment.
Figure 6B:
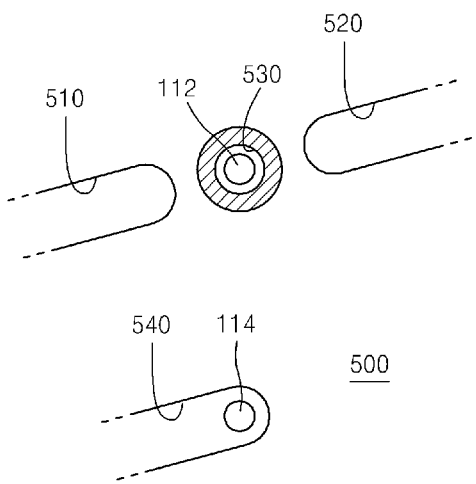
FIG. 6B is a diagram illustrating roughly an arrangement of a configuration of a part in a case where the device mounter head of FIG. 1 is in the operation state illustrated in FIG. 6A, according to an exemplary embodiment.
Figure 7:
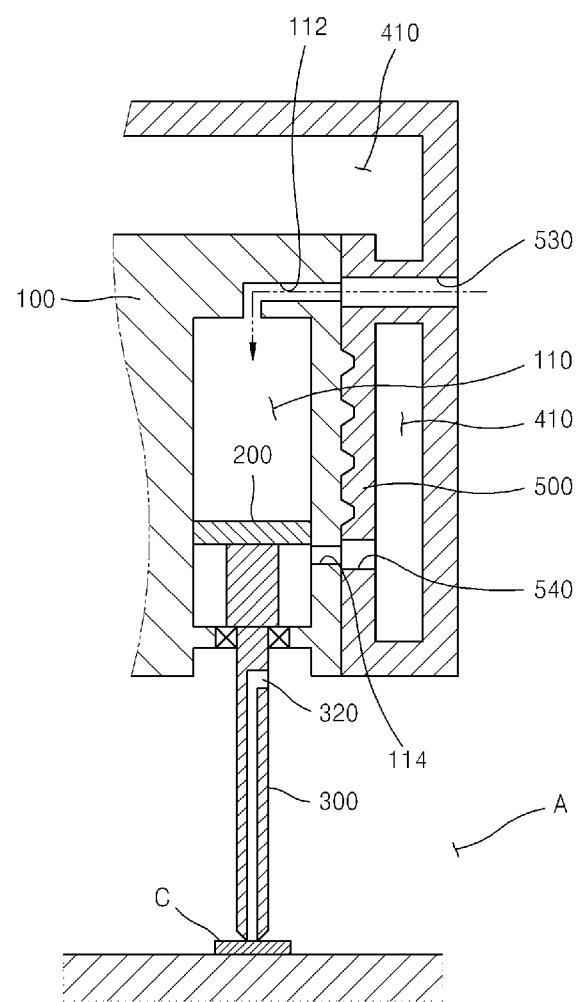
FIG. 7 is a cross-sectional view illustrating roughly a part of the device mounter head of FIG. 1 to show partially another operation state of the device mounter head of FIG. 1, according to an exemplary embodiment.
Figure 8:
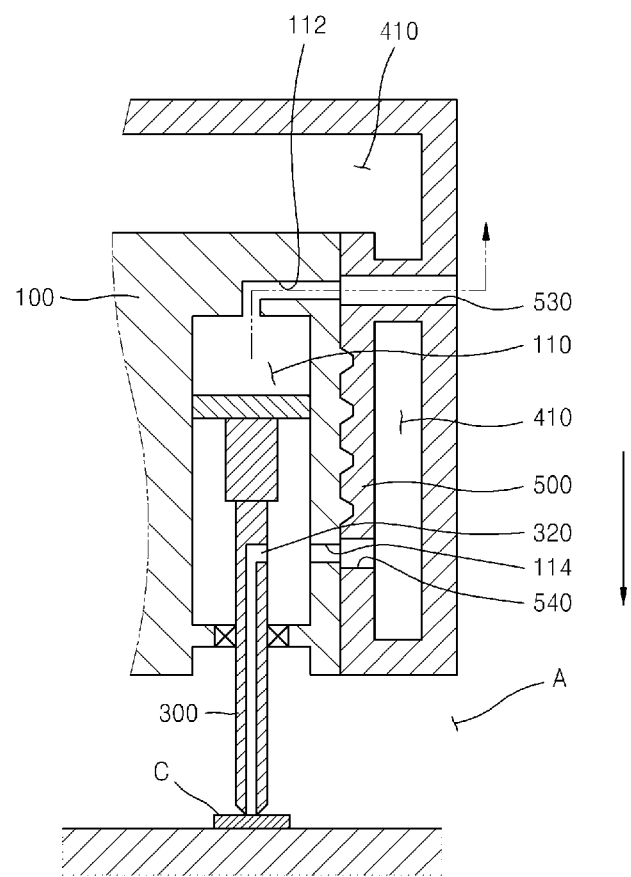
FIG. 8 is a cross-sectional view illustrating roughly a part of the device mounter head of FIG. 1 to show partially another operation state of the device mounter head of FIG. 1, according to an exemplary embodiment.
Figure 9A:
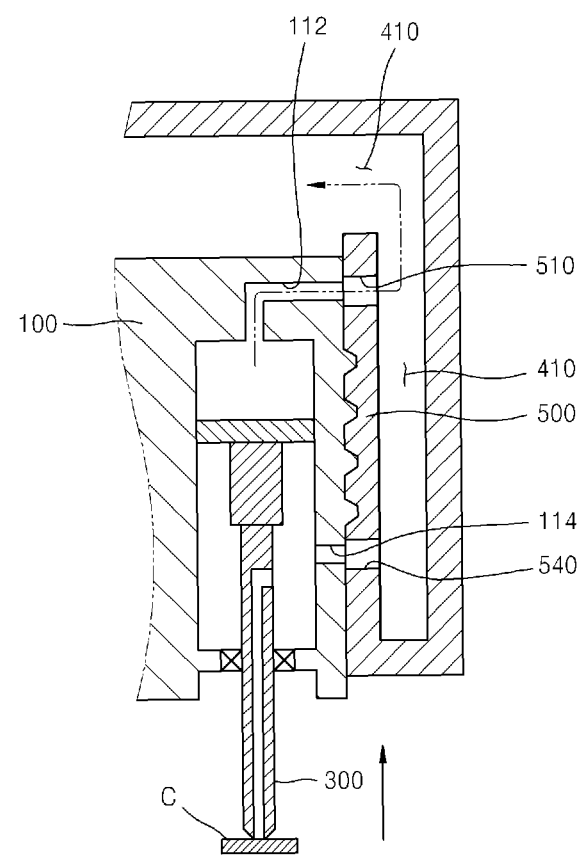
FIG. 9A is a cross-sectional view illustrating roughly a part of the device mounter head of FIG. 1 to show partially another operation state of the device mounter head of FIG. 1, according to an exemplary embodiment.
Figure 9B:
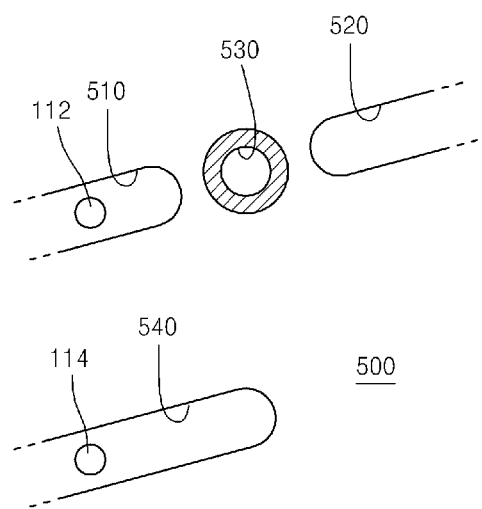
FIG. 9B is a diagram illustrating roughly an arrangement of a configuration of a part in a case where the device mounter head of FIG. 1 is in the operation state illustrated in FIG. 9A, according to an exemplary embodiment.
Figure 10:
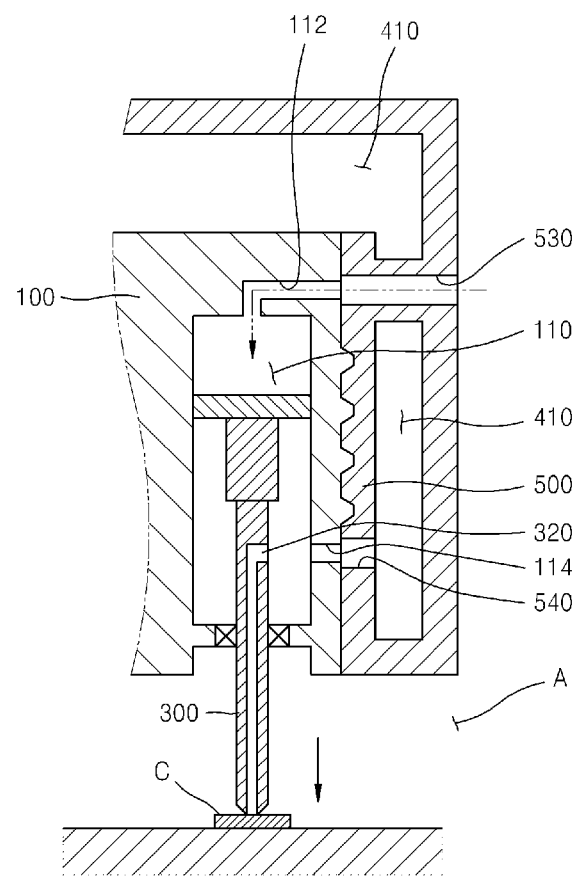
FIG. 10 is a cross-sectional view illustrating roughly a part of the device mounter head of FIG. 1 to show partially another operation state of the device mounter head of FIG. 1, according to an exemplary embodiment.
Figure 11:
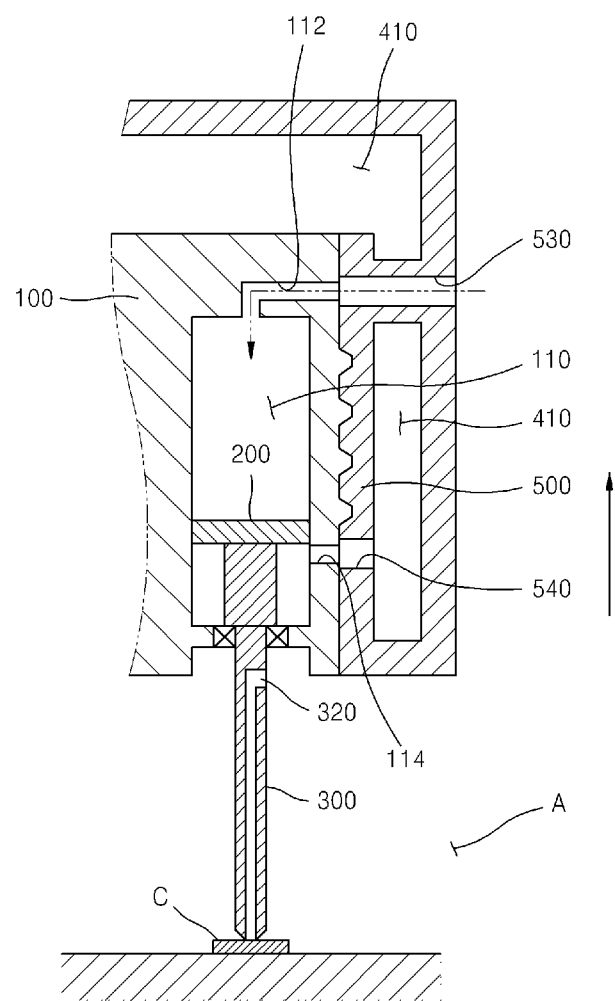
FIG. 11 is a cross-sectional view illustrating roughly a part of the device mounter head of FIG. 1 to show partially another operation state of the device mounter head of FIG. 1, according to an exemplary embodiment.
Figure 12A:
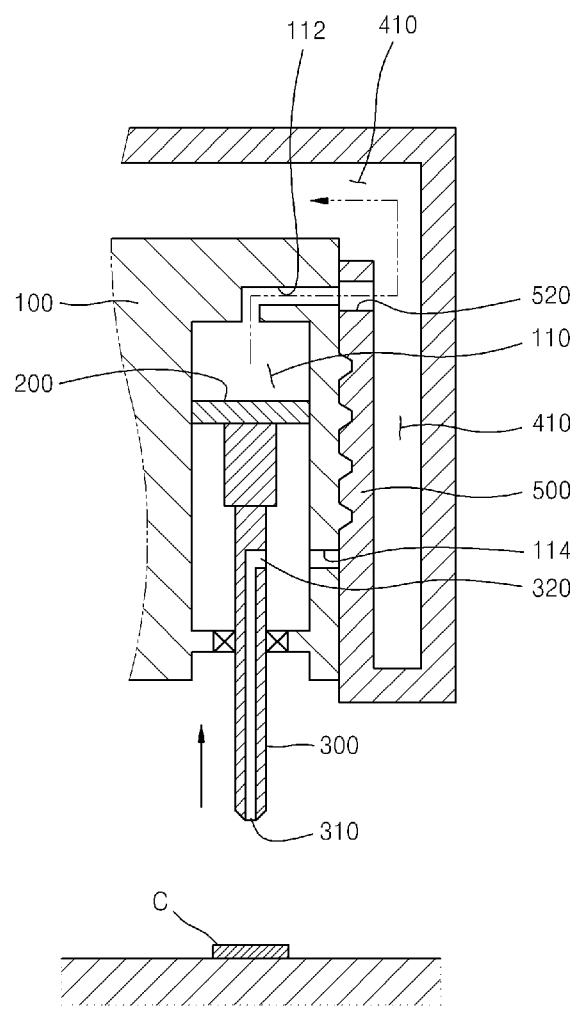
FIG. 12A is a cross-sectional view illustrating roughly a part of the device mounter head of FIG. 1 to show partially another operation state of the device mounter head of FIG. 1, according to an exemplary embodiment.
Figure 12B:
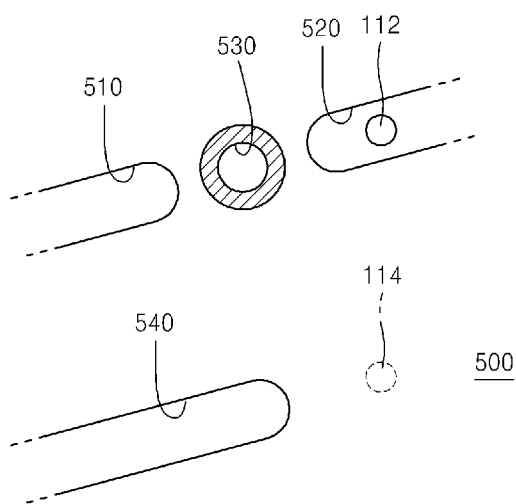
FIG. 12B is a diagram illustrating roughly an arrangement of a configuration of a part in a case where the device mounter head of FIG. 1 is in the operation state illustrated in FIG. 12A, according to an exemplary embodiment.

FIG. 1 is a perspective view of a device mounter head according to an exemplary embodiment, FIG. 2 is a perspective view of the device mounter head of FIG. 1 in which a part is cut out, and FIG. 3 is a cross-sectional view taken along a line III-III of the device mounter head of FIG. 1. FIG. 4 is a perspective view illustrating a configuration of a part of the device mounter head of FIG. 1, and FIG. 5 is a perspective view illustrating the configuration of the part of FIG. 4 together with a configuration of another part of the device mounter head of FIG. 1. FIG. 6A is a cross-sectional view illustrating roughly a part of the device mounter head of FIG. 1 to show partially an operation state of the device mounter head of FIG. 1, and FIG. 6B is a diagram illustrating roughly an arrangement of a configuration of a part in a case where the device mounter head of FIG. 1 is in the operation state illustrated in FIG. 6A. FIG. 7 is a cross-sectional view illustrating roughly a part of the device mounter head of FIG. 1 to show partially another operation state of the device mounter head of FIG. 1, and FIG. 8 is a cross-sectional view illustrating roughly a part of the device mounter head of FIG. 1 to show partially another operation state of the device mounter head of FIG. 1. FIG. 9A is a cross-sectional view illustrating roughly a part of the device mounter head of FIG. 1 to show partially another operation state of the device mounter head of FIG. 1, and FIG. 9B is a diagram illustrating roughly an arrangement of a configuration of a part in a case where the device mounter head of FIG. 1 is in the operation state illustrated in FIG. 9A. FIG. 10 is a cross-sectional view illustrating roughly a part of the device mounter head of FIG. 1 to show partially another operation state of the device mounter head of FIG. 1, and FIG. 11 is a cross-sectional view illustrating roughly a part of the device mounter head of FIG. 1 to show partially another operation state of the device mounter head of FIG. 1. FIG. 12A is a cross-sectional view illustrating roughly a part of the device mounter head of FIG. 1 to show partially another operation state of the device mounter head of FIG. 1, and FIG. 12B is a diagram illustrating roughly an arrangement of a configuration of a part in a case where the device mounter head of FIG. 1 is in the operation state illustrated in FIG. 12A.

Referring to FIGS. 1 through 12B, a device mounter head 1 according to an exemplary embodiment includes a cylinder block unit 100, a piston unit 200, a nozzle spindle 300, a pressure reducing portion, and a valve unit 500.

The cylinder block unit 100 is formed in a cylindrical shape as illustrated in FIGS. 2-4, and a guide protrusion 160 formed in a spiral shape is disposed on an outer circumference side of the cylinder block unit 100. On the cylinder block unit 100, a vertical spindle 150, which is disposed in a vertical direction and in which a hollow portion is formed, is fixed and joined to the cylinder block unit 100. A vent 152, communicating with the hollow portion of the vertical spindle 150, is formed in a lower side of the vertical spindle 150 near an upper surface of the cylinder block unit 100. Meanwhile, the vertical spindle 150 is disposed so as to be moved up and down and rotated by a driving means (not shown) so that the cylinder block unit 100 may move up and down and rotate.

As illustrated in FIG. 3, a plurality of cylinder spaces 110, having a cylindrical pillar shape and formed by extending in up and down directions, are formed in the cylinder block unit 100. A plurality of first communication vents 112 and a plurality of second communication vents 114 are formed in the cylinder block 100, and the plurality of first communication vents 112 are disposed so as to correspond to the plurality of cylinder spaces 110, respectively. The plurality of second communication vents 114 are also disposed so as to correspond to the plurality of cylinder spaces 110, respectively. That is, one of the first communication vents 112 and one of the second communication vents 114 are disposed so as to correspond to one of the cylinder spaces 110.

The first communication vents 112 are formed so as to penetrate from the outer circumference side of the cylinder block unit 100 into the cylinder spaces 110 so that the cylinder spaces 110 and a space outside the cylinder block unit 100 communicate with each other through the first communication vents 112.

The second communication vents 114, similar to the first communication vents 112, are formed so as to penetrate from the outer circumference side of the cylinder block unit 100 into the cylinder spaces 100 so that the cylinder spaces 110 and the space outside the cylinder block unit 100 communicate with each other through the second communication vents 114. The second communication vents 114 are disposed below the first communication vents 112.

The plurality of first communication vents 112 are disposed in a spiral shape along the outer circumference side of the cylinder block unit 100, and the plurality of second communication vents 114 are also disposed in a spiral shape parallel to the spiral shape of the first communication vents 112.

Referring to FIGS. 2 and 3, a sidewall and an upper side of the cylinder block unit 100 are surrounded by a housing 502 with respect to a space formed between the cylinder block unit 100 and the housing 502.

As illustrated in FIG. 3, piston units 200 are disposed in the respective cylinder spaces 110, and disposed so as to be moved up and down between the respective first communication vents 112 and the respective second communication vents 114. Outer circumference sides of the piston units 200 are configured to tightly contact inner circumference sides of the respective cylinder spaces 110, and each of the cylinder spaces 110 is divided into an upper space and a lower space by a corresponding piston unit of the piston units 200.

Nozzle spindles 300 are used to suck and grab components, are fixed and joined to lower sides of the respective piston units 200 as illustrated in FIG. 3, and are moved in the up and down directions together with the respective piston units 200. Lower parts of the nozzle spindles 300 are placed protruding under a lower side of the cylinder block unit 100, and inlet ports 310 for sucking and grabbing the components are formed at ends of the lower parts of the nozzle spindles 300, respectively. The inlet ports 310 of the nozzle spindles 300 extend to hollow portions formed inside the nozzle spindles 300, and nozzle communication vents 320 communicating with the hollow potions of the nozzle spindles 300 are formed in sides of the nozzle spindles 300, respectively. Accordingly, the nozzle communication vents 320 communicate with the inlet ports 310 through the hollow portions, respectively.

The nozzle communication vents 320 move in the up and down directions as the nozzle spindles 300 move in the up and down directions, respectively. When the nozzle spindles 300 move by a predetermined distance in the down direction, as illustrated in FIG. 7, the nozzle communication vents 320 leave the cylinder spaces 110 of the cylinder block unit 100 and enter a space below the lower side of the cylinder block unit 100. When the nozzle communication vents 320 are exposed to an outer atmosphere A, air pressure of the hollow portions of the nozzle spindles 300 and air pressure of the inlet ports 310 become equal to air pressure of the outer atmosphere A.

The pressure reducing portion is used to form a negative pressure space 410 in a space outside the cylinder spaces 110 of the cylinder block unit 100, that is, in the space formed between the cylinder block unit 100 and the housing 502 in the present exemplary embodiment. In the present exemplary embodiment, as illustrated in FIG. 3, a pressure reducing pump 400 is prepared as the pressure reducing portion. The pressure reducing pump 400 removes air from the hollow portion of the vertical spindle 150. Because the hollow portion of the vertical spindle 150 communicates with the negative pressure space 410 via the vent 152, the negative pressure space 410 having a negative pressure is formed between the outer circumference side of the cylinder block unit 100 and the housing 502 via the pressure reducing pump 400. The pressure reducing pump 400 may be a centrifugal pump, an axial flow pump or the like.

The valve unit 500, as illustrated in FIGS. 2 and 3, is disposed between the outer circumference side of the cylinder block unit 100 and the negative pressure space 410, and wraps closely around the outer circumference side of the cylinder block unit 100. In a state where the valve unit 500 tightly contacts the outer circumference side of the cylinder block unit 100, as illustrated in FIG. 5, the valve unit 500 is disposed so as to be moved relative to the cylinder block unit 100 in one side direction R1 and another side direction R2.

The valve unit 500 is formed together with the housing 502 in a single body, and moved relative to the cylinder block unit 100 together with the housing 502. In the present exemplary embodiment, as illustrated in FIG. 3, a motor M is joined to a gear unit 155 formed in the housing 502, to move the valve unit 500 and the housing 502 relative to the cylinder block unit 100.

In the present exemplary embodiment, although the valve unit 500 and the housing 502 are formed in a single body, the valve unit 500 and the housing 502 may be formed separately, and the valve unit 500 may be disposed so as to be moved relative to the cylinder block unit 100 independently of the housing 502.

As illustrated in FIG. 5, a first penetrating vent 510, a second penetrating vent 520, a third penetrating vent 530, and a fourth penetrating vent 540 are formed in the valve unit 500.

The first penetrating vent 510 communicates with the negative pressure space 410, and extends in the one side direction R1 on a relative movement path of the first communication vents 112 in the valve unit 500. That is, the first penetrating vent 510, as well as the first communication vents 112, is formed in a spiral shape with a relatively long length.

The second penetrating vent 520 is formed in the valve unit 500 apart from the first penetrating vent 510, and extends in the other side direction R2 on the relative movement path of the first communication vents 112 in the valve unit 500.

The third penetrating vent 530 is formed between the first penetrating vent 510 and the second penetrating vent 520. That is, the first penetrating vent 510 and the second penetrating vent 520 are disposed in forms extending in directions opposite to each other while the third penetrating vent 530 is centered therebetween. The third penetrating vent 530 is disposed on the relative movement path of the first communication vents 112 together with the first penetrating vent 510 and the second penetrating vent 520, and thus the first through third penetrating vents 510, 520, and 530 communicate with the first communication vents 112 in turn as the valve unit 500 moves in a spiral manner. Differently from the first penetrating vent 510 and the second penetrating vent 520, the third penetrating vent 530 does not communicate with the negative pressure space 410 but with a space outside the housing 502. That is, the third penetrating vent 530 communicates with the outer atmosphere A whose air pressure is higher than that of the negative pressure space 410.

The fourth penetrating vent 540 is disposed below the first through third penetrating vents 510, 520, and 530 so as to correspond to the second communication vents 114, and the fourth penetrating vent 540 communicates with the negative pressure space 410. The fourth penetrating vent 540, as illustrated in FIG. 5, is formed so as to communicate with the second communication vents 114 when the valve unit 500 is placed in such a way that the first communication vents 112 communicate with the third penetrating vent 530, and extends in the one side direction R1 parallel to the first communication vents 112.

The fourth penetrating vent 540 communicates with a portion of the second communication vents 114 or closes a portion of the second communication vents 114, as the valve unit 500 moves relative to the cylinder block unit 100. Referring to FIG. 5, the fourth penetrating vent 540 communicates with the second communication vents 114 when the first communication vents 112 communicates with the first penetrating vent 510, communicates with the second communication vents 114 when the first communication vents 112 communicates with the third penetrating vent 530, and closes the second communication vents 114 directly below the first communication vents 112 when the first communication vents 112 communicates with the second penetrating vent 520.

As explained above, a specific cylinder space 110 may be in a state (below, this state is represented as a P1 state for sake of convenience) where its first communication vent 112 communicates with the outer atmosphere A and its second communication vent 114 communicates with the negative pressure space 410, a state (below, this state is represented as a P2 state for sake of convenience) where both its first communication vent 112 and its second communication vent 114 communicate with the negative pressure space 410, or a state (below, this state is represented as a P3 state for sake of convenience) where its first communication vent 112 communicates with the negative pressure space 410 and its second communication vent 114 is closed. That is, communication between the first and second communication vents 112 and 114 of the specific cylinder space 110 and the negative pressure space 410 is allowed or blocked as the first through fourth penetrating vents 510, 520, 530, and 540 move together with the valve unit 500.

Next, a device mounting method using the device mounter head 1, according to an exemplary embodiment, and an effect of the method will be explained below.

The device mounting method using the device mounter head 1 according to the present exemplary embodiment includes a lowering operation, a grabbing and raising operation, a moving operation, a grabbing and lowering operation, a grab cancelling operation, and a raising operation.

As illustrated in FIG. 6A, the lowering operation is an operation of positioning one of the nozzle spindles 300 directly over an upper side of a component C such as a semiconductor chip and of lowering the one nozzle spindle 300.

When the nozzle spindle 300 is positioned directly over the upper side of the component C, the valve unit 500 is rotated relative to the cylinder block unit 100 until the third penetrating vent 530 of the valve unit 500 communicates with the first communication vent 112 of the cylinder space 110 corresponding to the nozzle spindle 300. Here, the device mounter head 1 may be configured in such a way that the valve unit 500 is rotated in a state where the cylinder block unit 100 is fixed, or, on the contrary, the cylinder block unit 100 is rotated in a state where the valve unit 500 is fixed.

As illustrated in FIG. 6B, when the valve unit 500 is positioned in such a way that the third penetrating vent 530 of the valve unit 500 communicates with the first communication vent 112, the second communication vent 114 of the cylinder space 110 communicates with the fourth penetrating vent 540. That is, the specific cylinder space 110 is in the P1 state. In the P1 state, the first communication vent 112 communicates with the outer atmosphere A, and communication between the first communication vent 112 and the negative pressure space 410 is blocked. Because the second communication vent 114 communicates with the negative pressure space 410, a space below the piston unit 200 corresponding to the cylinder space 110 has a pressure lower than that of a space above the piston unit 200. Accordingly, the piston unit 200 moves down, and air flows in the first communication vent 112 as illustrated by an arrow formed of a dotted line in FIG. 6A. Because the nozzle communication vent 320 of the nozzle spindle 300 is positioned under the piston unit 200 in the cylinder space 110 and the lower space of the cylinder space 110, that is, the space below the piston unit 200, communicates with the negative pressure space 410, negative pressure is formed in the inlet 310 of the nozzle spindle 300. Accordingly, as illustrated by an arrow formed of a dotted line in FIG. 6A, air flows in the inlet 310.

The nozzle spindle 300 may contact the component C in this state and may suck and grab the component C, but the nozzle spindle 300 may instead contact the component C in a state where the nozzle spindle 300 loses a sucking and grabbing power. The nozzle communication vent 320 should be exposed to the outer atmosphere A to cancel the sucking and grabbing power of the nozzle spindle 300. That is, as illustrated in FIG. 7, the nozzle communication vent 320 of the nozzle spindle 300 should leave the lower side of the cylinder block unit 100 by lowering continuously the nozzle spindle 300 in the P1 state. To this end, by positioning the cylinder block unit 100 high enough from the component C, the nozzle spindle 300 may protrude downward sufficiently to expose the nozzle communication vent 320.

When the nozzle communication vent 320 is exposed to the outer atmosphere A, and thus, the inlet 310 loses the sucking and grabbing power, the nozzle spindle 300 contacts the component C in a state where the nozzle spindle 300 does not have the sucking and grabbing power. Like this, it may be desirable that the nozzle spindle 300 loses the sucking and grabbing power before it makes a contact with the component C, because the sucking and grabbing power of the nozzle spindle 300 may raise the component C up in the air before it gets stuck to nozzle spindle 300, and this may cause difficulties in controlling a sticking position of the component C.

Next, the grabbing and raising operation is performed. The grabbing and raising operation is an operation of raising the nozzle spindle 300 in a state where the nozzle spindle 300 sucks and grabs the component C when the nozzle spindle 300 contacts the component C.

When the end of the nozzle spindle 300 contacts the component C, the cylinder block unit 100 is moved in the down direction by a predetermined distance so that the nozzle communication vent 320 of the nozzle spindle 300 is inserted again into the cylinder space 110 of the cylinder block unit 100. Here, the valve unit 500 and the housing 502 are also moved together with the cylinder block unit 100 in the down direction. When the cylinder block unit 100 is moved in the down direction, air of the cylinder space 110 in the space above the piston unit 200 flows into the outer atmosphere A in a direction indicated by an arrow formed of a dotted line in FIG. 8. Like this, when the nozzle communication vent 320 is inserted again into the cylinder space 110, negative pressure is formed in the inlet 310, and thus, the component C is sucked and grabbed.

When the component C is sucked and grabbed on the end of the nozzle spindle 300, by relatively rotating the valve unit 500 in the other side direction R2, as illustrated in FIG. 9B, the first communication vent 112 communicates with the first penetrating vent 510, and the second communication vent 114 communicates with the fourth penetrating vent 540. That is, the cylinder space 110 is in the P2 state. When the cylinder space 110 is in the P2 state, both the first communication vent 112 and the second communication vent 114 communicate with the negative pressure space 410. Accordingly, a state where the component C is sucked and grabbed on the nozzle spindle 300 is maintained, and air of the space above the piston unit 200 flows out from the cylinder block unit 100 as indicated by an arrow formed of a dotted line in FIG. 9A. Accordingly, the piston unit 200 is moved in the up direction, and the nozzle spindle 300 maintains continuously a state where the nozzle spindle 300 sucks and grabs the component C.

Like this, when the valve unit 500 is rotated more relatively in the other side direction R2 shown in FIG. 5, the third penetrating vent 530 communicates with the first communication vent 112 of an adjacent cylinder space 110, and thus, an adjacent nozzle spindle 300 performs again the above process. For example, when the valve unit 500 moves more relatively in the other side direction R2 in a state illustrated in FIG. 5, another first communication vent 112b adjacent to a specific first communication vent 112a in the other side direction R2 communicates with the third penetrating vent 530, and a second communication vent 114b directly under the first communication vent 112b communicates with the fourth penetrating vent 530. Accordingly, the nozzle spindle 300 corresponding to the first communication vent 112b adjacent to the specific first communication vent 112a descends. Here, a state where the specific first communication vent 112a communicates with the first penetrating vent 510 and a second communication vent 114a located directly under the specific first communication vent 112a communicates with the fourth penetrating vent 540, is maintained, and thus the nozzle spindle 300 corresponding to the specific first communication vent 112a maintains a state where the nozzle spindle 300 sucks and grabs the component C and a state where the nozzle spindle 300 is raised.

All nozzle spindles raise components in turn, as the valve unit 500 is rotated continuously in the other side direction R2.

Next, the moving operation is performed. The moving operation is an operation of moving the device mounter head 1 to a location where a component is to be put down. By controlling a driving means for driving the device mounter head 1, the device mounter head 1 is moved in such a way that the nozzle spindle 300 is positioned directly over the location where the component C is to be put down. Here, the cylinder space 110 corresponding to the nozzle spindle 300 and all the other cylinder spaces 110 are in the P2 state.

Next, the grabbing and lowering operation is performed, and the grabbing and lowering operation is an operation of lowering the nozzle spindle 300 in a state where the component C is sucked and grabbed on the nozzle spindle 300. As illustrated in FIG. 10, after the nozzle spindle 300 is positioned directly above the location where the component C is to be put down, the first communication vent 112 of the cylinder space 110 communicates with the third penetrating vent 530 of the valve unit 500 by moving the valve unit 500 in the one side direction R1. That is, the cylinder space 110 is in the P1 state. Accordingly, as indicated by an arrow formed of a dotted line in FIG. 10, air flows into the cylinder space 110 of the space above the piston unit 200, the lower space of the cylinder space 110 communicates with the negative pressure space 410, and thus, the piston unit 200 and the nozzle spindle 300 are moved in the down direction.

When the nozzle spindle 300 moves continually in the down direction, the component C touches a substrate or the like. Here, it is desirable to position the cylinder block unit 100 at a predetermined height apart from the substrate so that the nozzle communication vent 320 of the nozzle spindle 300 does not leave the lower side of the cylinder block unit 100. When the nozzle communication vent 320 is exposed to the outer atmosphere A before the component C reaches safely the substrate, the component C may drop from the nozzle spindle 300, and may not reach safely a desired position.

Next, the grab cancelling operation is performed. The grab cancelling operation is an operation of cancelling the operation in which the nozzle spindle 300 sucks and grabs the component C. In the present exemplary embodiment, the grab cancelling operation further includes an operation of exposing the nozzle communication vent 320 to the outer atmosphere A so that negative pressure of the inlet 310 is cleared. The operation of exposing the nozzle communication vent 320 includes an operation of raising the cylinder block unit 100 relative to the nozzle spindle 300 in a state where the nozzle spindle 300 is stopped. That is, in the operation of exposing the nozzle communication vent 320, in a state where the component C reaches safely the substrate or the like, as in FIG. 11, the cylinder block unit 100 is moved by a predetermined distance in the up direction so that the nozzle communication vent 320 of the nozzle spindle 300 leaves of the cylinder space 110. Here, the valve unit 500 and the housing 502 are also moved together with the cylinder block unit 100. Because the cylinder space 110 is in the P1 state, the nozzle spindle 300 maintains a position thereof, and only the cylinder block unit 100, the valve unit 500, and the housing 502 are moved in the up direction. When the nozzle communication vent 320 is exposed to the outer atmosphere A, the end of the nozzle spindle 300 loses the sucking and grabbing power. Accordingly, the nozzle spindle 300 and the component C are separated from each other.

Next, the raising operation is performed. The raising operation is an operation of raising the nozzle spindle in a state where the nozzle spindle 300 and the component C are separated from each other. In the raising operation, as illustrated in FIG. 12B, the first communication vent 112 communicates with the second penetrating vent 520 by further moving the valve unit 500 in the one side direction R1. When the valve unit 500 is positioned in such a way that the first communication vent 112 communicates with the second penetrating vent 520, the second communication vent 114 is closed. That is, the cylinder space 110 is in the P3 state. Accordingly, the upper space of the cylinder space 110, that is, the space above the piston unit 200, communicates with the negative pressure space 410, and the lower space of the cylinder space 110, that is, the space below the piston unit 200 communicates with the outer atmosphere A. Accordingly, air flows in a direction indicated by an arrow formed of a dotted line in FIG. 12A, and the nozzle spindle 300 puts the component C down and moves in the up direction.

Like this, when the valve unit 500 is moved continually in the one side direction R1, all the nozzle spindles may mount components on the substrate.

Meanwhile, in the present exemplary embodiment, a case where a high pressure space is the outer atmosphere A is explained, but the high pressure space may be a space in which high pressure is maintained by a pressure pump.

In addition, in the present exemplary embodiment, a case where a plurality of cylinder spaces is disposed in the cylinder block unit 100 is explained, but only one cylinder space may be formed.

In addition, in the present exemplary embodiment, a case where the negative space 410 is formed in the space outside the cylinder block unit 100 is explained, but a device mounter head according to the inventive concept may be embodied in another form. For example, the inventive concept may be embodied in a form where a hollow portion is formed in a central part of a cylinder block unit, first and second communication vents are formed so as to penetrate into the hollow portion, and negative pressure acts upon the hollow portion. In this case, a valve unit may be disposed between the hollow portion and the cylinder block unit and also disposed in a form where the valve unit tightly contacts the cylinder block unit.

While the inventive concept has been particularly shown and described with reference to the exemplary embodiments, it will be understood by those of ordinary skill in the art that various changes in form and details may be made therein without departing from the spirit and scope of the inventive concept as defined by the following claims.

What is claimed is:
1. A device mounter head comprising:
 a cylinder block unit comprising:
  a cylinder space;
  a first communication vent through which the cylinder space and another space provided inside or outside the cylinder block unit communicate with each other; and
  a second communication vent disposed below the first communication vent and through which the cylinder space and the other space communicate with each other;

a piston unit which moves between the first communication vent and the second communication vent in the cylinder space;

a nozzle spindle disposed on a lower side of the piston unit, and in which an end having an inlet is protruded from the cylinder block unit, and a nozzle communication vent communicating with the inlet is formed on a side of the nozzle spindle;

a pressure controlling portion which provides predetermined pressure in the other space; and a valve unit disposed between the cylinder block unit and the other space, wherein the valve unit comprises a plurality of vents and moves relative to the cylinder block unit and allows or blocks communication between the other space and at least one of the first communication vent and the second communication vent.

2. The device mounter head of claim 1, wherein the plurality of vents of the valve unit comprises first through fourth vents, wherein the first vent communicates with the other space and extends in one side direction on the valve unit, wherein the second vent communicates with the other space and extends in another side direction on the valve unit, wherein the third vent communicates with a high pressure space whose pressure is higher than the predetermined pressure provided in the other space, and is formed between the first vent and the second vent, and wherein the fourth vent communicates with the other space, communicates with the second communication vent in a state where the first communication vent communicates with the first vent, communicates with the second communication vent in a state where the first communication vent communicates with the third vent, and extends in the one side direction so that the second communication vent is closed in a state where the first communication vent communicates with the second vent.

3. The device mounter head of claim 2, wherein the high pressure space comprises an outer atmosphere space outside the cylinder block unit.

4. The device mounter head of claim 1, wherein the cylinder block unit further comprises:

a plurality of cylinder spaces, comprising the cylinder space, formed in the cylinder block unit;

a plurality of piston units, comprising the piston unit, corresponding to the plurality of cylinder spaces, respectively; and a plurality of nozzle spindles, comprising the nozzle spindle, corresponding to the plurality of cylinder spaces, respectively.

5. The device mounter head of claim 4, wherein the cylinder block unit further comprises a plurality of first communication vents, comprising the first communication vent, disposed apart from one another in a spiral shape; and a plurality of second communication vents, comprising the second communication vent, disposed apart from one another in a spiral shape, wherein the valve unit is disposed between the cylinder block unit and the other space, and disposed so as to be moved in a spiral shape relative to the cylinder block unit.

6. The device mounter head of claim 5, wherein the valve unit is disposed between the cylinder block unit and the other space, and comprises first through fourth vents, wherein the first vent communicates with the other space and extends in one side direction on a relative movement path of the first communication vent in the valve unit, the second vent communicates with the other space and extends in another side direction on the relative movement path of the first communication vent in the valve unit, the third vent communicates with a high pressure space whose pressure is higher than the predetermined pressure provided in the other space, and is formed between the first vent and the second vent, and the fourth vent communicates with the other space, communicates with the second communication vent in a state where the first communication vent communicates with the first vent, communicates with the second communication vent in a state where the first communication vent communicates with the third vent, and extends in the one side direction on a relative movement path of the second communication vent so that the second communication vent is closed in a state where the first communication vent communicates with the second vent.

7. The device mounter head of claim 1, wherein the nozzle communication vent is disposed so that the nozzle communication vent leaves the cylinder space when the nozzle spindle moves downward by a predetermined distance.

8. The device mounter head of claim 6, wherein the cylinder block unit and the valve unit are disposed so as to be moved up and down together.

9. A method of mounting a component on a substrate using the device mounter head of claim 1, the method comprising:

positioning the valve unit in such a way that communication between the first communication vent and the other space is blocked and the second communication vent communicates with the other space, and then, lowering the nozzle spindle so that the nozzle spindle approaches the component;

positioning the valve unit in such a way that the first and second communication vents communicate with the other space, and then, raising the nozzle spindle in a state where the nozzle spindle sucks and grabs the component;

moving the device mounter head;

positioning the valve unit in such a way that communication between the first communication vent and the other space is blocked and the second communication vent communicates with the other space, and then, lowering the nozzle spindle, in the state where the nozzle spindle sucks and grabs the component, so that the component is mounted on the substrate;

clearing the state where the nozzle spindle sucks and grabs the component; and positioning the valve unit in such a way that the first communication vent communicates with the other space and communication between the second communication vent and the other space is blocked, and then raising the nozzle spindle.

10. The method of claim 9, wherein the clearing of the state comprises exposing the nozzle communication vent to the outer atmosphere space outside the cylinder block unit so that the predetermined pressure formed in the inlet is cleared.

11. A device mounter head comprising:

a cylinder block unit comprising at least one cylinder in which a piston unit moving along the at least one cylinder is disposed;

a pressure control unit which controls pressure inside the at least one cylinder so that the piston moves along the at least one cylinder based on the controlled pressure;

a nozzle which is connected to the piston unit, and comprises an inlet exposed to an atmosphere outside the cylinder block unit and a nozzle communication vent connected to the inlet and provided with the controlled pressure, and a valve unit disposed between the cylinder block unit and another space, wherein the valve unit comprises a plurality of vents and moves relative to the cylinder block unit, wherein the inlet is configured to suck, grab and release a component using the controlled pressure, and wherein the cylinder block unit is configured to rotate around a central axis of the cylinder block unit so that pressure inside a first cylinder of the at least one cylinder is different from pressure inside a second cylinder of the at least one cylinder, whereby a first nozzle connected to a first piston in the first cylinder maintains a state in which a component is sucked and grabbed by a first inlet of the first nozzle when a second nozzle connected to a second piston in the second cylinder approaches another component to suck and grab the other component.

12. The device mounter head of claim 11, wherein the cylinder block unit is configured to move to control the pressure provided to the nozzle communication vent.

13. The device mounter head of claim 11, wherein each of the at least one cylinder comprises a first communication unit and a second communication unit disposed below the first communication unit, wherein the pressure control unit controls the pressure through the first and second communication units.

14. The device mounter head of claim 13, wherein the piston unit moves between the first communication unit and the second communication unit based on the controlled pressure.

15. A method of mounting a component in a substrate using the device mounter head of claim 11, the method comprising:

controlling pressure inside and outside the at least one cylinder so that the piston moves along the at least one cylinder based on the controlled pressure; and providing the controlled pressure to the inlet of the nozzle at least through the nozzle communication vent.

16. A method of mounting a component in a substrate using the device mounter head of claim 11, the method comprising:

(a) providing first pressure in the at least one cylinder so that the piston moves in a first direction to push the nozzle outside the cylinder block unit so that the inlet contacts the component;

(b) providing second pressure, lower than the first pressure, to the nozzle communication vent so that the component is sucked and grabbed by the inlet;

(c) providing the second pressure in the at least one cylinder so that the piston moves in a second direction opposite to the first direction to pull the nozzle in the second direction;

(d) rotating the cylinder block unit so that the component sucked and grabbed by the inlet is disposed above the substrate;

(e) providing the first pressure in the at least one cylinder so that the piston moves in the first direction to push the nozzle outside the cylinder block unit;

(f) exposing the nozzle communication vent to the atmosphere outside the cylinder block unit so that the component is released to the substrate; and (g) providing the second pressure in the at least one cylinder so that the piston moves in the second direction.

17. The method of claim 16, wherein operation (a) comprises exposing the nozzle communication vent to the atmosphere outside the cylinder block unit, wherein operation (b) is performed by controlling the nozzle communication vent to move inside the at least one cylinder, wherein operation (e) comprises providing the second pressure to the nozzle communication unit, and wherein operation (g) comprises providing the first pressure to the inlet and the nozzle communication unit.

18. The method of claim 16, wherein during operation (d), operation (a) is performed with respect to another cylinder so that another component is sucked and grabbed by an inlet of a nozzle connected to a piston unit in the other cylinder.

19. The method of claim 9, wherein the exposing of the nozzle communication vent comprises moving the cylinder block unit relative to the nozzle spindle.

* * * * *